United States Patent
Kondakova et al.

(10) Patent No.: US 7,374,828 B2
(45) Date of Patent: May 20, 2008

(54) ORGANIC ELECTROLUMINESCENT DEVICES WITH ADDITIVE

(75) Inventors: Marina E. Kondakova, Kendall, NY (US); Ralph H. Young, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 125 days.

(21) Appl. No.: 10/729,737

(22) Filed: Dec. 5, 2003

(65) Prior Publication Data

US 2005/0123797 A1    Jun. 9, 2005

(51) Int. Cl.
*H01L 51/50* (2006.01)

(52) U.S. Cl. .................. 428/690; 428/917; 313/504; 313/506

(58) Field of Classification Search ............ 428/690, 428/917; 313/504, 506, 112; 257/98
See application file for complete search history.

(56) References Cited

U.S. PATENT DOCUMENTS

| | | | | |
|---|---|---|---|---|
| 6,573,651 | B2 * | 6/2003 | Adachi et al. | 313/504 |
| 6,893,743 | B2 * | 5/2005 | Sato et al. | 428/690 |
| 2002/0071963 | A1 | 6/2002 | Fujii | |
| 2002/0086180 | A1 * | 7/2002 | Seo et al. | 428/690 |
| 2002/0139303 | A1 * | 10/2002 | Yamazaki et al. | 118/719 |
| 2002/0182441 | A1 | 12/2002 | Lamansky et al. | |
| 2002/0197511 | A1 * | 12/2002 | D'Andrade et al. | 428/690 |
| 2003/0091862 | A1 * | 5/2003 | Tokito et al. | 428/690 |
| 2003/0111666 | A1 | 6/2003 | Nishi et al. | |
| 2003/0141809 | A1 | 7/2003 | Furugori et al. | |
| 2004/0062947 | A1 * | 4/2004 | Lamansky et al. | 428/690 |
| 2005/0260440 | A1 * | 11/2005 | Seo et al. | 428/690 |

FOREIGN PATENT DOCUMENTS

| | | |
|---|---|---|
| EP | 1 215 945 | 6/2002 |
| WO | 02/51206 | 6/2002 |

OTHER PUBLICATIONS

M. A. Baldo, et al., "Very high-efficiency green organic light-emitting devices based on electrophosphorescence", Applied Physics Letters, vol. 75, No. 1, 1999, pp. 4-6.

X. Zhou, et al., " High-efficiency electrophosphorescent organic light-emitting diodes with double light-emitting layers", Applied Physics Letters, vol. 81, No. 21, 2002, pp. 4070-4072.

* cited by examiner

*Primary Examiner*—Dawn Garrett
(74) *Attorney, Agent, or Firm*—Arthur E. Kluegel

(57) ABSTRACT

Disclosed is an electroluminescent device comprising a cathode and an anode and, located therebetween, a light-emitting layer (LEL) comprising a phosphorescent guest material, a hole- and electron-transporting host material, and an efficiency-enhancing material having an ionization potential lower than that of the host material and a triplet energy level that is lower than that of the phosphorescent guest material by no more than 0.2 eV. Such a device provides useful light emission features.

28 Claims, 1 Drawing Sheet

US 7,374,828 B2

ORGANIC ELECTROLUMINESCENT DEVICES WITH ADDITIVE

FIELD OF THE INVENTION

This invention relates to an electroluminescent device comprising a cathode and an anode and, located therebetween, a light-emitting layer (LEL) comprising a phosphorescent guest material, a hole- and electron-transporting host material, and an efficiency-enhancing material having an ionization potential lower than that of the host material and a triplet energy level that is lower than that of the phosphorescent guest material by no more than 0.2 eV.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172, 862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often >100V.

More recent organic EL devices include an organic EL element consisting of extremely thin layers (e.g. <1.0 µm) between the anode and the cathode. Herein, the term "organic EL element" encompasses the layers between the anode and cathode. Reducing the thickness lowered the resistance of the organic layer and has enabled devices that operate at much lower voltage. In a basic two-layer EL device structure, described first in U.S. Pat. No. 4,356,429, one organic layer of the EL element adjacent to the anode is specifically chosen to transport holes, and therefore, it is referred to as the hole-transporting layer, and the other organic layer is specifically chosen to transport electrons, and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al (J. Applied Physics, Vol. 65, Pages 3610-3616, (1989)). The light-emitting layer commonly consists of a host material doped with a guest material, also known as a dopant. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

Many emitting materials that have been described as useful in an OLED device emit light from their excited singlet state by fluorescence. The excited singlet state can be created when excitons formed in an OLED device transfer their energy to the singlet excited state of the dopant. However, it is generally believed that only 25% of the excitons created in an EL device are singlet excitons. The remaining excitons are triplet, which cannot readily transfer their energy to the dopant to produce the singlet excited state of a dopant. This results in a large loss in efficiency since 75% of the excitons are not used in the light emission process.

Triplet excitons can transfer their energy to a dopant if it has a triplet excited state that is low enough in energy. If the triplet state of the dopant is emissive it can produce light by phosphorescence. In many cases singlet excitons can also transfer their energy to lowest singlet excited state of the same dopant. The singlet excited state can often relax, by an intersystem crossing process, to the emissive triplet excited state. Thus, it is possible, by the proper choice of host and dopant, to collect energy from both the singlet and triplet excitons created in an OLED device and to produce a very efficient phosphorescent emission. The term electrophosphorescence is sometimes used to denote electroluminescence wherein the mechanism of luminescence is phosphorescence.

Another process by which excited states of a dopant can be created is a sequential process in which a hole is trapped by the dopant and subsequently recombines with an electron, or an electron is trapped and subsequently recombines with a hole, in either case producing an excited state of the dopant directly. Singlet and triplet states, and fluorescence, phosphorescence, and intersystem crossing are discussed in J. G. Calvert and J. N. Pitts, Jr., Photochemistry (Wiley, N.Y., 1966) and further discussed in publications by S. R. Forrest and coworkers such as M. A. Baldo, D. F. O'Brien, M. E. Thompson, and S. R. Forrest, Phys. Rev. B, 60, 14422 (1999). The singular term "triplet state" is often used to refer to a set of three electronically excited states of spin 1 that have nearly identical electronic structure and nearly identical energy and differ primarily in the orientation of the net magnetic moment of each state. A molecule typically has many such triplet states with widely differing energies. As used hereinafter, the term "triplet state" of a molecule will refer specifically to the set of three spin-1 excited states with the lowest energy, and the term "triplet energy" will refer to the energy of these states relative to the energy of the ground state of the molecule. Similarly, the term "singlet energy" will refer to the energy of the lowest excited singlet state relative to that of the ground state of the molecule.

One class of useful phosphorescent materials is the transition metal complexes having singlet ground states and triplet excited states. For example, fac-tris(2-phenylpyridinato-N,$C^{2'}$)iridium(III) (Ir(ppy)$_3$) strongly emits green light from a triplet excited state owing to, first, the large spin-orbit coupling of the heavy atom and, second, the lowest excited state, which is a charge transfer state, having a Laporte allowed (orbital-symmetry-allowed) transition to the ground state (K. A. King, P. J. Spellane, and R. J. Watts, J. Am. Chem. Soc., 107, 1431 (1985), M. G. Colombo, T. C. Brunold, T. Reidener, H. U. Güdel, M. Fortsch, and H.-B. Bürgi, Inorg. Chem., 33, 545 (1994). Small-molecule, vacuum-deposited OLEDs having high efficiency have also been demonstrated with Ir(ppy)$_3$ as the phosphorescent material and 4,4'-N,N'-dicarbazole-biphenyl (CBP) as the host (M. A. Baldo, S. Lamansky, P. E. Burrows, M. E. Thompson, and S. R. Forrest, Appl. Phys. Lett., 75, 4 (1999), T. Tsutsui, M.-J. Yang, M. Yahiro, K. Nakamura, T. Watanabe, T. Tsuji, Y. Fukuda, T. Wakimoto, and S. Miyaguchi, Jpn. J. Appl. Phys., 38, L1502 (1999), T. Watanabe, K. Nakamura, S. Kawami, Y.Fukuda, T. Tsuji, T. Wakimoto, S. Miyaguchi. Proc. SPIE, 4105, 175-182 (2001)). LeCloux et al. in International Patent Application WO 03/040256 A2, and Petrov et al. in International Patent Application WO 02/02714 A2 teach additional iridium complexes for electroluminescent devices.

Additives have been used to improve the efficiency of triplet OLED devices. In U.S. 2002/0071963 A1, 4-(dicyanomethylene)-2-t-butyl-6-(1,1,7,7-tetramethyljulolidyl-9- enyl)-4H-pyran (DCJTB) was used as an additive to a triplet light-emitting layer. However, DCJTB suffers from having singlet emission in the red region of the spectrum and therefore can affect the color of the emission of a triplet OLED device. In particular, if an OLED device with blue or green emission is desired, a red contribution from DCJTB emission would be undesirable.

Notwithstanding these developments, there remains a need to improve the functioning of OLEDs containing phosphorescent organometallic materials so as to provide useful light emissions.

SUMMARY OF THE INVENTION

The invention provides an electroluminescent device comprising a cathode and an anode and, located therebetween, a light-emitting layer (LEL) comprising a phosphorescent guest material, a hole- and electron-transporting host material, and an efficiency-enhancing material having an ionization potential lower than that of the host material and a triplet energy level that is lower than that of the phosphorescent guest material by no more than 0.2 eV. The invention also provides a display and an area lighting device employing the device and a process for emitting light using the device.

The device provides useful light emission with improved efficiency.

DETAILED DESCRIPTION OF THE INVENTION

Figure 1:
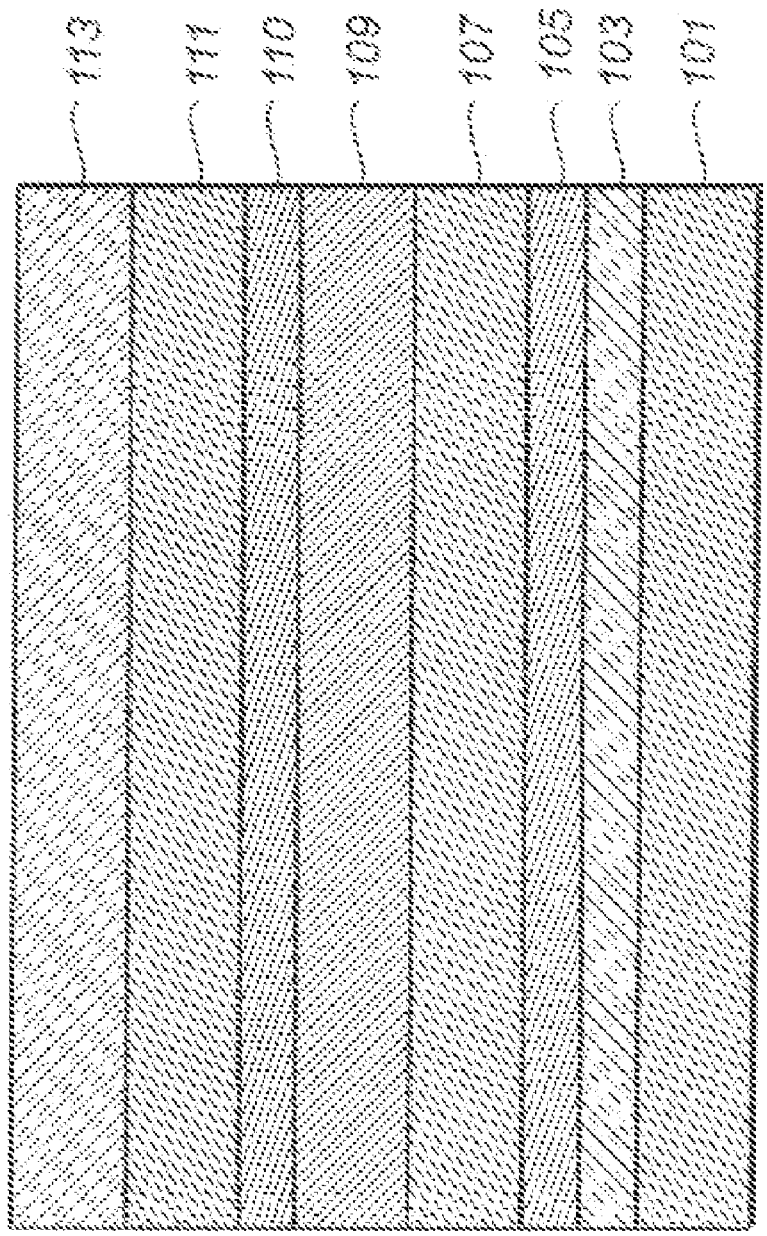
FIG. 1 shows a schematic cross-section of a typical OLED device in which this invention may be used.

The electroluminescent device is summarized above. It includes a cathode, an anode, and a light-emitting layer comprising a phosphorescent light-emitting material, a hole- and electron-transporting host material, and an efficiency-enhancing material having an ionization potential lower than that of the host material and a triplet energy that is lower than that of the phosphorescent guest material by no more than 0.2 eV. In one desirable embodiment, the triplet energy of the efficiency-enhancing material is higher than that of the phosphorescent guest material. The device can also include layers such as a hole-injecting layer, a hole-transporting layer, a hole-blocking layer, an electron-transporting layer, or more than one of these optional layers.

According to the present invention, the light-emitting layer 109 of the EL device comprises a host material, one or more guest materials for emitting light, and an efficiency-enhancing material whose nature will become evident. At least one of the guest materials is a phosphorescent complex such as one comprising an organometallic compound including a 5th-row transition element, e.g. platinum or iridium. The light-emitting guest material(s) is typically present in an amount of from 1 to 20 by weight % of the light-emitting layer, and conveniently from 3 to 7% by weight of the light-emitting layer. For convenience, the phosphorescent complex guest material may be referred to herein as a phosphorescent material. The phosphorescent material typically includes one or more ligands, for example, monoanionic ligands that can be coordinated to a metal through an $sp^2$ carbon and a heteroatom. Conveniently, the ligand can be a N-heterocylcic compound such as phenylpyridine (ppy) or phenylisoquiolin (piq) or derivatives or analogs thereof. Examples of some useful phosphorescent organometallic materials include tris(2-phenylpyridinato-N,$C^{2'}$)iridium(III) and bis(2-phenylpyridinato-N,$C^{2'}$)platinum(II).

Phosphorescent and related materials are also described in WO 00/57676, WO 00/70655, WO 01/41512 A1, WO 02/15645 A1, US 2003/0017361 A1, WO 01/93642 A1, WO 01/39234 A2, U.S. Pat. No. 6,458,475 B1, WO 02/071813 A1, U.S. Pat. No. 6,573,651 B2, US 2002/0197511 A1, WO 02/074015 A2, U.S. Pat. No. 6,451,455 B1, US 2003/0072964 A1, US 2003/0068528 A1, U.S. Pat. No. 6,413,656 B1, U.S. Pat. No. 6,515,298 B2, U.S. Pat. No. 6,451,415 B1, U.S. Pat. No. 6,097,147, US 2003/0124381 A1, US 2003/0059646 A1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003073387A, JP 2003 073388A, US 2003/0141809 A1, US 2003/0040627 A1, JP 2003059667A, JP 2003073665A, and US 2002/0121638 A1.

The emission wavelengths of cyclometallated Ir(III) complexes of the type $IrL_3$ and $IrL_2L'$, such as the green-emittingfac-tris(2-phenylpyridinato-N,$C^{2'}$)iridium(III) and bis(2-phenylpyridinato-N,$C^{2'}$)iridium(III)(acetylacetonate) may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand L'. Examples of red emitters are the bis(2-(2'-benzothienyl) pyridinato-N,$C^{3'}$)iridium(III)(acetylacetonate) and tris(1-phenylisoquinolinato-N,C,$C^{2'}$)iridium(III), tris(2-phenylquinolinato-N,$C^{2'}$)iridium(III), and tris(1-phenylisoquinolinato-N,$C^{2'}$)iridium(III), and tris(3-phenylisoquinolinato-N,$C^{2'}$)iridium(III). A blue-emitting example is bis(2-(4,6-difluorophenyl)-pyridinato-N,$C^{2'}$)iridium(III)(picolinate).

Red electrophosphorescence has been reported, using bis(2-(2'-benzo[4,5-a]thienyl)pyridinato-N,$C^3$)iridium (acetylacetonate)[$btp_2Ir(acac)$] as the phosphorescent material (C. Adachi, S. Lamansky, M. A. Baldo, R. C. Kwong, M. E. Thompson, and S. R. Forrest, *App. Phys. Lett.*, 78, 1622-1624 (2001)).

Other important phosphorescent materials include cyclometallated Pt(II) complexes such as cis-bis(2-phenylpyridinato-N,$C^{2'}$)platinum(II), cis-bis(2-(2'-thienyl)pyridinato-N, $C^{3'}$)platinum(II), cis-bis(2-(2'-thienyl)quinolinato-N,$C^{5'}$) platinum(II), or (2-(4,6-difluorophenyl)pyridinato-N,$C^{2'}$) platinum(II)(acetylacetonate). Pt(II)porphyrin complexes such as 2,3,7,8,12,13,17,18-octaethyl-21H,23H-porphine platinum(II) are also useful phosphorescent materials.

Still other examples of useful phosphorescent materials include coordination complexes of the trivalent lanthanides such as $Tb^{3+}$ and $Eu^{3+}$ (J. Kido et al., *Appl. Phys. Lett.*, 65, 2124 (1994)).

Suitable host materials should preferably be selected so that transfer of a triplet exciton can occur efficiently from the host material to the phosphorescent guest material but cannot occur efficiently from the phosphorescent material to the host material. Therefore, it is highly desirable that the triplet energy of the phosphorescent material be lower than the triplet energy of the host. Generally speaking, a large triplet energy implies a large optical bandgap. However, the band gap of the host should not be chosen so large as to cause an unacceptable barrier to injection of charge carriers into the light-emitting layer and an unacceptable increase in the drive voltage of the OLED. Suitable host materials are described in WO 00/70655 A2; 01/39234 A2; 01/93642 A1; 02/074015 A2; 02/15645 A1; and US 20020117662. Suitable hosts include certain aryl amines, triazoles, indoles and carbazole compounds. Examples of desirable hosts are 4,4'-bis(carbazol-9-yl)biphenyl (CBP), 4,4'-bis(carbazol-9-yl)-2, 2'-dimethyl-biphenyl (CDBP), 1,3-bis(carbazol-9-yl)benzene, and poly(N-vinylcarbazole), including their derivatives.

Desirable host materials are capable of forming a continuous film. In addition, desirable host materials may be hole- and electron-transporting, that is, they may allow the transport of both holes and electrons. Carbazole containing compounds such as CBP (see C. Adachi et al., *Organic Electronics*, 2, 37-43 (2001)) can serve as both hole- and electron-transporting host materials. Suitable host materials include carbazole derivatives such as those represented by Formula 1.

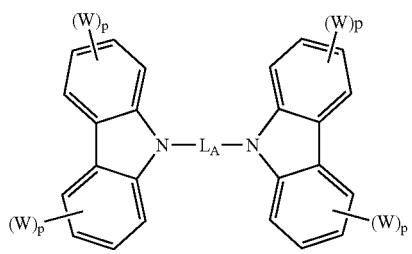

(1)

In Formula 1, W independently represents hydrogen or an independently selected substituent, such as a methyl group, p independently is 0-4, and $L_A$ represents a linking group. Suitable linking groups include arylene groups such as phenylene or biphenylene groups, or aliphatic or alicyclic groups such as 1,3-propyl or 1,3-cyclobutyl. Particularly suitable are compounds of Formula 1 wherein W and $L_A$ do not contain additional fused rings such as naphthalene rings. Examples include the following:

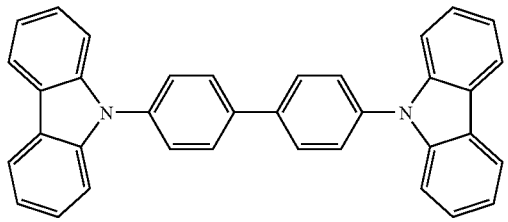

1-1

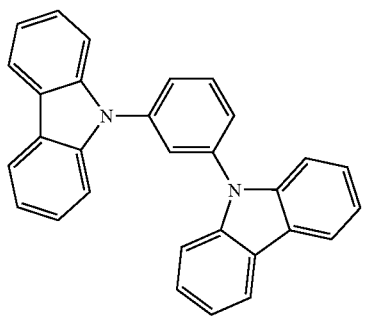

1-2

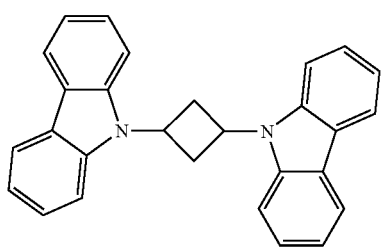

1-3

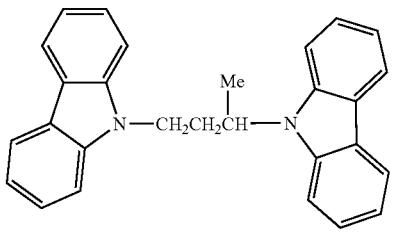

1-4

The light-emitting layer may contain more than one host material in order to improve the device's film morphology, electrical properties, light emission efficiency, and lifetime. The light-emitting layer may contain a first host material that has good hole-transporting properties, and a second host material that has good electron-transporting properties, which together can form a hole- and electron-transporting host material.

The efficiency-enhancing material suitable for use in the LEL is selected to have the following two useful properties: an ionization potential that is less than that of the host material and a triplet energy that is not lower than the triplet energy of the phosphorescent guest material by more than about 0.2 eV. Examples of suitable compounds are:

1,1-Bis(4-di-p-tolylaminophenyl)cyclohexane (TAPC);
1,1-Bis(4-di-p-tolylaminophenyl)-4-phenylcyclohexane;
1,1-Bis(4-di-p-tolylaminophenyl)-4-methylcyclohexane;
1,1-Bis(4-di-p-tolylaminophenyl)-3-phenylpropane;
4,4',4"-Tris(diphenylamino)triphenylamine (TDATA);
4,4',4"-Tris[(3-methylphenyl)phenylamino]triphenylamine (MTDATA);
Bis[4-(N,N-diethylamino)-2-methylphenyl](4-methylphenyl)methane;
Bis[4-(N,N-diethylamino)-2-methylphenyl](4-methylphenyl)ethane;
4-(4-Diethylaminophenyl)triphenylmethane; and
4,4'-Bis(4-diethylaminophenyl)diphenylmethane.

An example of a preferred efficiency enhancing material is 4,4',4"-tris[(3-methylphenyl)phenylamino]triphenylamine (MTDATA) when used in combination with a host material such as 4,4'-bis(carbazol-9-yl)-biphenyl (CBP) and a phosphorescent light-emitting material such asfac tris(2-phenylpyridinato-N,$C^{2'}$)iridium(III)(Ir(ppy)$_3$).

The role of ionization potential is not completely understood, but it is believed that the efficiency-enhancing material functions by a sequential process wherein a hole is trapped by the efficiency-enhancing material and subsequently recombines with an electron in the host material, resulting in an excited state of one material or the other. It is further believed that the energy of this excited state is transferred to the phosphorescent guest material, which emits it as phosphorescent light. The ionization potential is defined as the energy required to remove an electron from the highest occupied molecular orbital (HOMO) of a substance. It can be measured, for instance, by photoelectron spectroscopy. For example, C. Adachi et al., *Organic Electronics*, 2, 37-43 (2001), report the ionization potentials of several materials including CBP (6.3 eV) and MTDATA (5.1 eV). According to these values, MTDATA satisfies the first criterion for use as an efficiency-enhancing material with CBP as the host. Alternatively, since only differences between ionization potentials are required, oxidation potentials obtained by electrochemical methods in solution can be used instead. Thus, equivalent to the first property, indicated above, is the property that the oxidation potential of the efficiency-enhancing material should be less than that of the host material. It should be understood that the same electrochemical method, solvent, and reference electrode or reference material (e.g., ferrocene) should be used to evaluate the oxidation potentials of the efficiency-enhancing material and the host material. An example of the use of both photoelectron spectroscopic and electrochemical methods to determine ionization and oxidation potentials is given by L. -B. Lin et al., *Appl. Physics Lett.*, 72, 864 (1998).

The ionization energy of the efficiency-enhancing material must be less than that of the host material. However, if that ionization energy is too low, there may exist an "exciplex" state at sufficiently low energy that transfer of its energy to the phosphorescent guest material is impeded. Such an "exciplex" state typically would involve partial or complete transfer of an electron from a molecule of the intended efficiency-enhancing material to a molecule of the host material. Hence, it is desirable, though not absolutely required, that the efficiency-enhancing material not be too good an electron donor. For this purpose, it is frequently desirable that the difference in ionization energy between the efficiency-enhancing material and the host material be less than about 1 eV and more desirable that it be less than about 0.5 eV.

Values of the triplet energy and ionization or oxidation potential for many compounds can be found in S. L. Murov, I. Carmichael, and G. L. Hug, Handbook of Photochemistry, $2^{nd}$ ed. (Marcel Dekker, N.Y., 1993) and in the references by Adachi et al. and Lin et al., cited above. Values for additional compounds can often be estimated from known values for similar compounds.

The role of triplet energy values is also not completely understood, but it is believed to be approximately as follows. If the triplet energy of the efficiency-enhancing material satisfies the second criterion, the barrier to transfer of triplet energy from the efficiency-enhancing material directly to the phosphorescent guest material, if any, is not insurmountably large. To facilitate such energy transfer, it is desirable that the triplet energy of the efficiency-enhancing material also not be lower than that of the host material by more than 0.2 eV. This requirement is also stated in equation (1):

$$T_E \geq T_H - 0.2 \text{eV} \tag{eq. 1}$$

wherein, $T_E$ represents the triplet energy level of the efficiency-enhancing material, and $T_H$ represents the triplet energy level of the host material. If the efficiency-enhancing material has this property, any barrier to transfer of triplet energy from it to the host material, with subsequent transfer to the phosphorescent guest material, is not insurmountably large. In one desirable embodiment, the triplet energy of the efficiency-enhancing material is higher than that of the phosphorescent material.

Triplet energy is conveniently measured by any of several methods, as discussed for instance in the book by Murov et al., cited above. One convenient method, well known to those skilled in the art, is to record the phosphorescence spectrum at low temperature. Typically, that spectrum has several partially-resolved peaks or shoulders. At a certain wavelength ($\lambda_0$), the intensity of phosphorescence reaches half of the intensity at the shortest-wavelength peak or shoulder. The energy corresponding to $\lambda_0$ is considered to be the triplet energy. For example, Adachi et al., in *Organic Electronics*, 2, 37-43 (2001), show the spectrum of MTDATA in their FIG. 4(*b*). From the caption, and from previously published data (Baldo et al., *Phys. Rev. B* 62, 10958 (2000)), it is clear that the dashed line in that figure is the phosphorescence spectrum of MTDATA. The value of $\lambda_0$ evaluated from that figure is 513 nm, corresponding to a wavenumber ($1/\lambda_0$) of 19,500 cm$^{-1}$ and a triplet energy of 19,500/8066=2.42 eV. For another example, FIG. 3 in the same paper by Baldo et al. shows a phosphorescence spectrum of Ir(ppy)$_3$. The value of $\lambda_0$ evaluated from that figure is about 490 nm and corresponds to a triplet energy of 2.53 eV. Thus, the triplet energy of MTDATA is below that of Ir(ppy)$_3$, but by less than 0.2 eV, and MTDATA satisfies the second requirement for an efficiency-enhancing material to be used with Ir(ppy)$_3$ as the phosphorescent material. A phosphorescent material with red emission would have a triplet energy below 2.1 eV. The triplet energy of MTDATA would exceed that of such a phosphorescent material.

The triplet state of a compound can also be calculated. The triplet state energy for a molecule is obtained as the difference between the ground state energy (E(gs)) of the molecule and the energy of the lowest triplet state (E(ts)) of the molecule, both given in eV. These energies are obtained using the B3LYP method as implemented in the Gaussian98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31G*, with LACV3P being the preferred method. For any remaining atoms, any published basis set and pseudopotential may be used. MIDI!, 6-31G* and LANL2DZ are used as implemented in the Gaussian98 computer code and LACV3P is used as implemented in the Jaguar 4.1 (Schrodinger, Inc., Portland Oreg.) computer code. The energy of each state is computed at the minimum-energy geometry for that state. The difference in energy between the two states is further modified by equation (2) to give the triplet state energy (E(t)):

$$E(t) = 0.84*(E(ts) - E(gs)) + 0.35 \tag{eq. 2}$$

For polymeric or oligomeric materials, it is sufficient to compute the triplet energy over a monomer or oligomer of sufficient size so that additional units do not substantially change the computed triplet energy.

The calculated values for the triplet state energy of a given compound may typically show some deviation from the experimental values. Thus, the calculations should be used only as a rough guide in the selection of appropriate materials.

In addition to the two properties described above, the ionization potential and the triplet energy level, it is often desirable that the efficiency-enhancing material be substantially non-emissive, by which we mean that it does not emit light when used together with the phosphorescent material in the host material. For example, the efficiency-enhancing material may not be capable of emitting light when it is present in the host material, regardless of whether the phosphorescent material is present. Alternatively, the efficiency-enhancing material may emit light when it is present in the host material without the phosphorescent material, but the energy of the emitting excited state(s) may exceed that of the phosphorescent material, and that energy may be transferred efficiently to the phosphorescent material instead of being emitted by the efficiency-enhancing material. As an example of this case, a material with blue emission can be used as an efficiency-enhancing material together with a phosphorescent material that emits green light, if the energy of excitation of the former material is efficiently transferred to the phosphorescent material rather than being emitted as blue light. It will be understood that no material is totally non-emissive. For purposes of this disclosure, a material is termed non-emissive if no more than about half of its singlet energy on average, and no more than about 10% of its triplet energy on average are emitted as light when the material is present together with the phosphorescent material in the host material. A material intended for use as an efficiency-enhancing material may be emissive when the phosphorescent material is present at sufficiently low concentration, but it is often desirable that an efficiency-enhancing material be non-emissive when the phosphorescent material is present at the desired concentration. The non-emissive property is advantageous when the emission color of the phosphorescent dopant is already optimized, because it prevents contamination of that color by the emission color of the efficiency-enhancing material.

Many tertiary aromatic amines, including triarylamines, diarylalkylamines, and aryldialkylamine fulfill the requirements for efficiency enhancing materials, when used together with a host such as CBP and a phosphorescent material whose phosphorescence is in the visible region of the spectrum, for example the blue region of the spectrum or at longer wavelengths, such as green, yellow, orange, or red. In the case of tertiary aromatic amines with multiple amine groups (e.g. bis[triarylamines]), the amine groups can be linked with alkylene or, in some instances, arylene groups. Some non-limiting examples of such materials are:

1,1-Bis(4-di-p-tolylaminophenyl)cyclohexane (TAPC)
1,1-Bis(4-di-p-tolylaminophenyl)-4-phenylcyclohexane
1,1-Bis(4-di-p-tolylaminophenyl)-4-methylcyclohexane
1,1-Bis(4-di-p-tolylaminophenyl)-3-phenylpropane (TAPPP)
4,4',4"-Tris(diphenylamino)triphenylamine (TDATA)
4,4',4"-Tris[(3-methylphenyl)phenylamino]triphenylamine (MTDATA)
Bis[4-(N,N-diethylamino)-2-methylphenyl](4-methylphenyl)methane (MPMP)
Bis[4-(N,N-diethylamino)-2-methylphenyl](4-methylphenyl)ethane
4-(4-Diethylaminophenyl)triphenylmethane
4,4'-Bis(4-diethylaminophenyl)diphenylmethane.

For example, the triplet energy of TAPC is approximately equal to that of the structurally related compound, triphenylamine, namely 3.0 eV, which exceeds that of both the typical host material CBP and a typical phosphorescent material, Ir(ppy)$_3$. The ionization potential of TAPC is about 5.4 eV, which is smaller than the ionization potential of CBP. (See the book by Murov et al. and the article by Lin et al., both cited above). Thus, TAPC is suitable for use as an efficiency-enhancing material with CBP as the host material and Ir(ppy)$_3$ as the phosphorescent material.

In one suitable embodiment the efficiency enhancing material comprises two or more triaryl amines linked together, such as a material of Formula (2a).

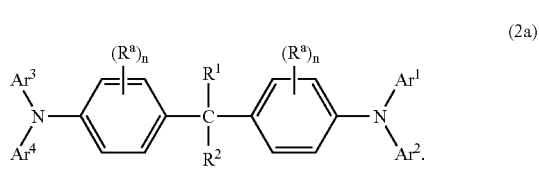

(2a)

In Formula (2a), R$^1$ and R$^2$ represent H or substituents, provided R$^1$ and R$^2$ can join to form a ring. For example R$^1$ and R$^2$ can be methyl groups or join to form a cyclohexyl ring group. Ar$^1$-Ar$^4$ represent independently selected aromatic groups, for example phenyl groups or tolyl groups. R$^a$ represents hydrogen or an independently selected substituent, such as a methyl group, and n is independently selected as 0-4. In one desirable embodiment, R$^1$, R$^2$, R$^a$, and Ar$^1$-Ar$^4$ do not contain fused aromatic rings.

Examples of materials of formula 2a are:

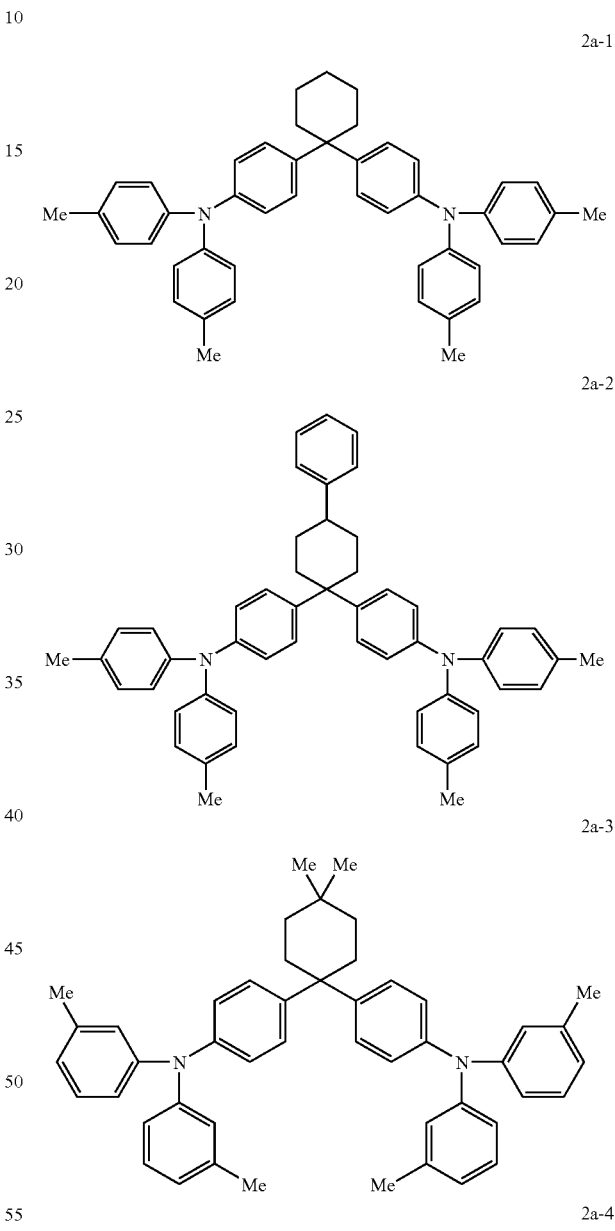

-continued

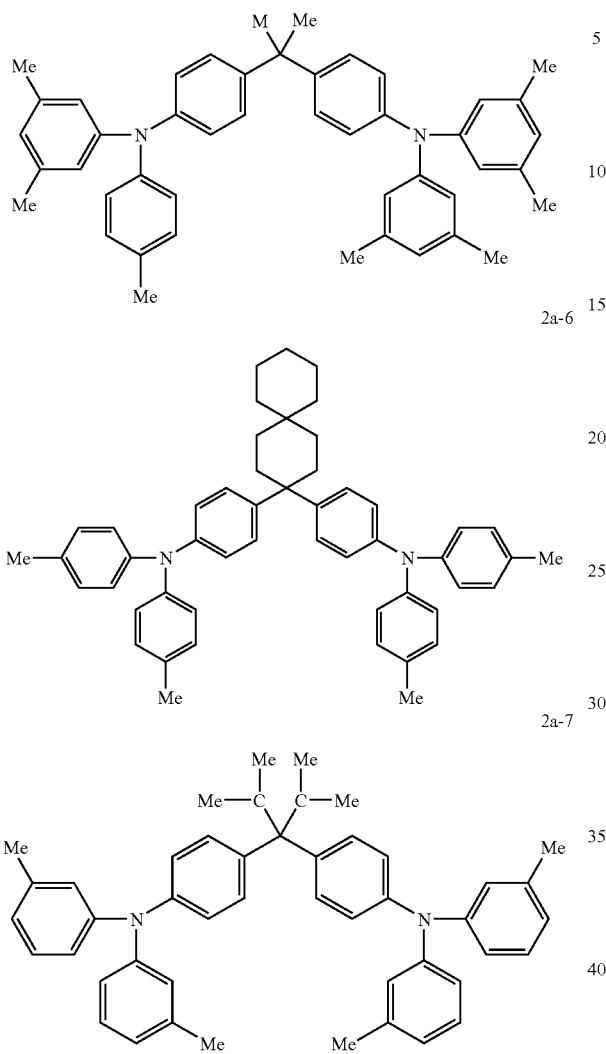

In one desirable embodiment the efficiency enhancing material comprises a material represented by Formula 2b:

$$\text{(2b)}$$

In Formula 2b, $Ar^5$-$Ar^{10}$ independently represent aromatic groups, for example phenyl groups and tolyl groups. $R^b$ independently represents hydrogen or an independently selected substituent, for example a methyl group, and m is independently selected as 0-4. In one desirable embodiment, $R^b$ and $Ar^5$-$Ar^{10}$ do not contain fused aromatic rings.

Examples of suitable materials of formula 2a are:

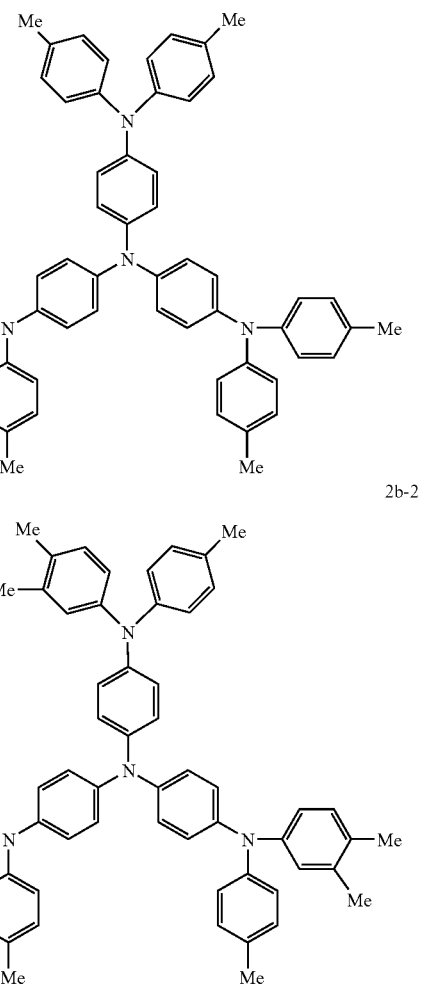

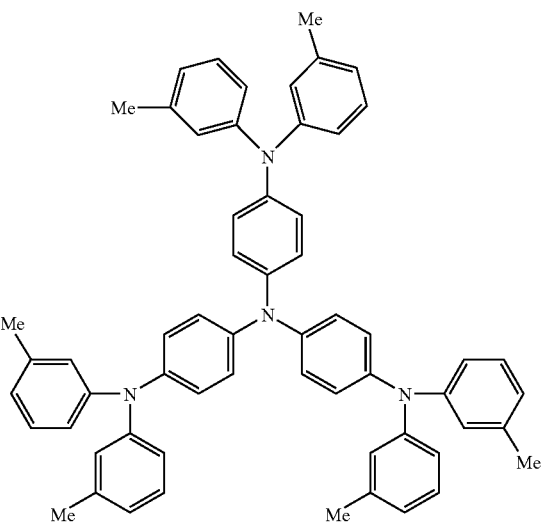

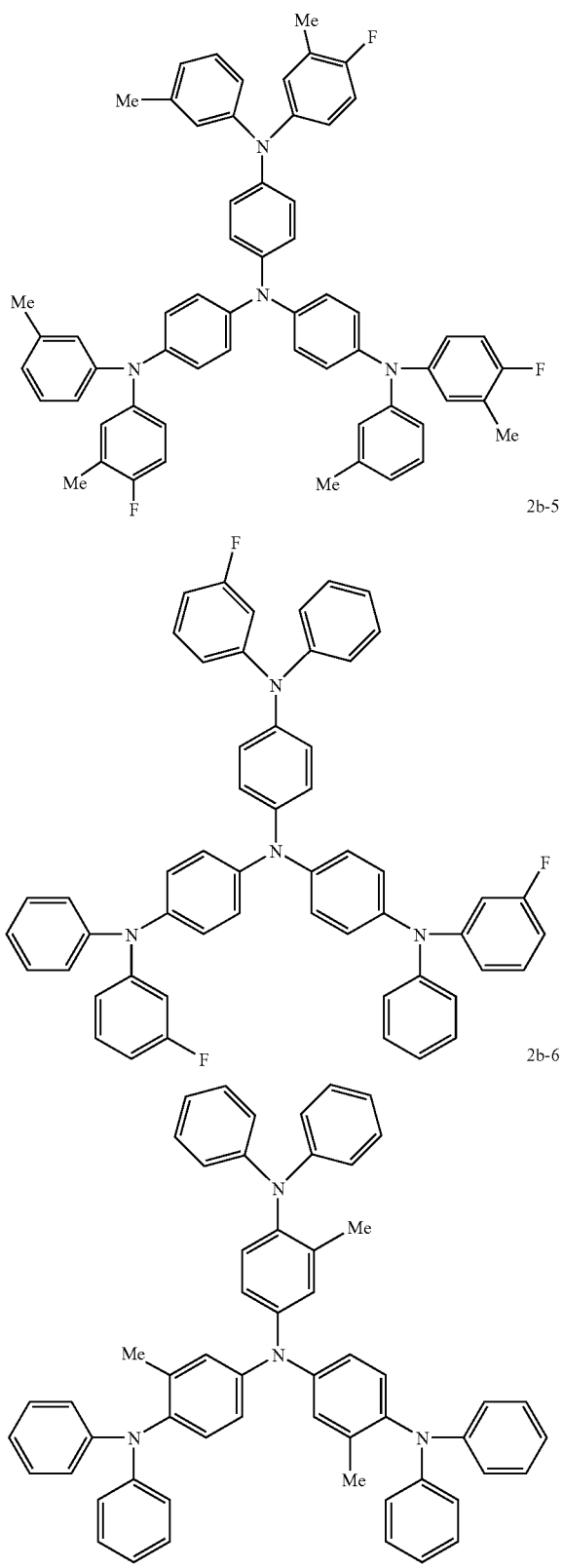

The efficiency-enhancing material is conveniently present at a concentration of from 1 to 30% by weight of the light-emitting layer, and suitably 3 to 10%. Two or more efficiency-enhancing materials can also be used in combination with one another.

The thickness of the light-emitting layer can be between 2 and 100 nm and is suitably between 5 and 50 nm.

The addition of an efficiency-enhancing material provides an electroluminescent device with improved luminous yield and power efficiency.

Unless otherwise specifically stated, use of the term "substituted" or "substituent" means any group or atom other than hydrogen. Unless otherwise provided, when a group (including a compound or complex) containing a substitutable hydrogen is referred to, it is also intended to encompass not only the unsubstituted form, but also form further substituted derivatives with any substituent group or groups as herein mentioned, so long as the substituent does not destroy properties necessary for utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl) carbonylamino, p-dodecyl-phenylcarbonylamino, p-tolyl-carbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1(N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in many OLED device configurations using small molecule materials, oligomeric materials, polymeric materials, or combinations thereof. These range from very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure according to the present invention and especially useful for a small molecule device, is shown in FIG. 1 and is comprised of a substrate 101, an anode 103, a hole-injecting layer 105, a hole-transporting layer 107, a light-emitting layer 109, a hole-blocking layer 110, an electron-transporting layer 111, and a cathode 113. These layers are described in detail below. Note that the substrate 101 may alternatively be located adjacent to the cathode 113, or the substrate 101 may actually constitute the anode 103 or cathode 113. The organic layers between the anode 103 and cathode 113 are conveniently referred to as the organic EL element. Also, the total combined thickness of the organic layers is desirably less than 500 nm.

The anode 103 and cathode 113 of the OLED are connected to a voltage/current source through electrical conductors. The OLED is operated by applying a potential between the anode 103 and cathode 113 such that the anode 103 is at a more positive potential than the cathode 113. Holes are injected into the organic EL element from the anode 103 and electrons are injected into the organic EL element from the cathode 113. Enhanced device stability can sometimes be achieved when the OLED is operated in an AC mode where, for some time period in the AC cycle, the potential bias is reversed and no current flows. An example of an AC driven OLED is described in U.S. Pat. No. 5,552,678.

Substrate

The OLED device of this invention is typically provided over a supporting substrate 101 where either the cathode 113 or anode 103 can be in contact with the substrate. The electrode in contact with the substrate 101 is conveniently referred to as the bottom electrode. Conventionally, the bottom electrode is the anode 103, but this invention is not limited to that configuration. The substrate 101 can either be light transmissive or opaque, depending on the intended direction of light emission. The light transmissive property is desirable for viewing the EL emission through the substrate 101. Transparent glass or plastic is commonly employed in such cases. The substrate 101 can be a complex structure comprising multiple layers of materials. This is typically the case for active matrix substrates wherein TFTs are provided below the OLED layers. It is still necessary that the substrate 101, at least in the emissive pixelated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials, such as silicon, ceramics, and circuit board materials. Again, the substrate 101 can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. For applications where EL emission is viewed only through the cathode 113, the transmissive characteristics of the anode 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short circuits or enhance reflectivity.

Cathode

When light emission is viewed solely through the anode 103, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)), the cathode being capped with a thicker layer of a conductive metal. Here, the EIL preferably includes a low work function metal or a salt of a low-work-function metal, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode 113 must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-Injecting Layer (HIL)

A hole-injecting layer 105 may be provided between anode 103 and hole-transporting layer 107. The hole-injecting material can serve to improve the film formation property of subsequent organic layers and to facilitate injection of holes into the hole-transporting layer 107. Suitable materials for use in the hole-injecting layer 105 include, but are not limited to, porphyrinic compounds as described in U.S. Pat. No. 4,720,432, plasma-deposited fluorocarbon polymers as described in U.S. Pat. No. 6,208,075, and some aromatic amines, for example, MTDATA (4,4',4''-tris[(3-methylphenyl)phenylamino]triphenylamine). Alternative hole-injecting materials reportedly useful in organic EL devices are described in EP 0 891 121 A1 and EP 1 029 909 A1. A hole-injection layer is conveniently used in the present invention, and is desirably a plasma-deposited fluorocarbon polymer. The thickness of a hole-injection layer containing a plasma-deposited fluorocarbon polymer can be in the range of 0.2 to 200 nm and suitably in the range of 0.3 to 1.5 nm.

Hole-Transporting Layer (HTL)

While not always necessary, it is often useful to include a hole-transporting layer in an OLED device. The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines is those which include at least two aromatic tertiary amine moieties as described in U.S. Pat. No. 4,720,432 and U.S. Pat. No. 5,061,569. Such compounds include those represented by structural formula (A).

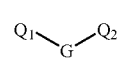

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

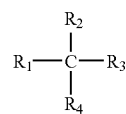

B where
$R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

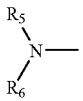
                                C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by formula (C), linked through an arylene group. Useful tetraaryldiamines include those represented by formula (D).

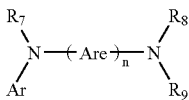
                                D wherein
  each Are is an independently selected arylene group, such as a phenylene or anthracene moiety,
  n is an integer of from 1 to 4, and
  Ar, $R_7$, $R_8$, and $R_9$ are independently selected aryl groups.
  In a typical embodiment, at least one of Ar, $R_7$, $R_8$, and $R_9$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single aromatic tertiary amine compound or a mixture of such compounds. Specifically, one may employ a triarylamine, such as a triarylamine satisfying the formula (B), in combination with a tetraaryldiamine, such as indicated by formula (D). Illustrative of useful aromatic tertiary amines are the following:
  1,1-Bis(4-di-p-tolylaminophenyl)cyclohexane
  1,1-Bis(4-di-p-tolylaminophenyl)-4-phenylcyclohexane
  N,N,N',N'-tetraphenyl-4,4'''-diamino-1,1':4',1'':4'',1'''-quaterphenyl
  Bis(4-dimethylamino-2-methylphenyl)phenylmethane
  1,4-bis[2-[4-[N,N-di(p-toly)amino]phenyl]vinyl]benzene (BDTAPVB)
  N,N,N',N'-Tetra-p-tolyl-4,4'-diaminobiphenyl
  N,N,N',N'-Tetraphenyl-4,4'-diaminobiphenyl
  N,N,N',N'-tetra-1-naphthyl-4,4'-diaminobiphenyl
  N,N,N',N'-tetra-2-naphthyl-4,4'-diaminobiphenyl
  N-Phenylcarbazole
  4,4'-Bis[N-(1-naphthyl)-N-phenylamino]biphenyl (NPB)
  4,4'-Bis[N-(1-naphthyl)-N-(2-naphthyl)amino]biphenyl (TNB)
  4,4'-Bis[N-(1-naphthyl)-N-phenylamino]p-terphenyl
  4,4'-Bis[N-(2-naphthyl)-N-phenylamino]biphenyl
  4,4'-Bis[N-(3-acenaphthenyl)-N-phenylamino]biphenyl
  1,5-Bis[N-(1-naphthyl)-N-phenylamino]naphthalene
  4,4'-Bis[N-(9-anthryl)-N-phenylamino]biphenyl
  4,4'-Bis[N-(1-anthryl)-N-phenylamino]-p-terphenyl
  4,4'-Bis[N-(2-phenanthryl)-N-phenylamino]biphenyl
  4,4'-Bis[N-(8-fluoranthenyl)-N-phenylamino]biphenyl
  4,4'-Bis[N-(2-pyrenyl)-N-phenylamino]biphenyl
  4,4'-Bis[N-(2-naphthacenyl)-N-phenylamino]biphenyl
  4,4'-Bis[N-(2-perylenyl)-N-phenylamino]biphenyl
  4,4'-Bis[N-(1-coronenyl)-N-phenylamino]biphenyl
  2,6-Bis(di-p-tolylamino)naphthalene
  2,6-Bis[di-(1-naphthyl)amino]naphthalene
  2,6-Bis[N-(1-naphthyl)-N-(2-naphthyl)amino]naphthalene
  N,N,N',N'-Tetra(2-naphthyl)-4,4''-diamino-p-terphenyl
  4,4'-Bis{N-phenyl-N-[4-(1-naphthyl)-phenyl]amino}biphenyl
  2,6-Bis[N,N-di(2-naphthyl)amino]fluorene
  4,4',4''-tris[(3-methylphenyl)phenylamino]triphenylamine (MTDATA)
  4,4'-Bis[N-(3-methylphenyl)-N-phenylamino]biphenyl (TPD)

Another class of useful hole-transporting materials includes polycyclic aromatic compounds as described in EP 1 009 041. Tertiary aromatic amines with more than two amine groups may be used, including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

It is also possible for the hole-transporting layer to comprise two or more sublayers of differing compositions.

The thickness of the hole-transporting layer can be between 10 and about 500 nm and suitably between 50 and 300 nm.

Light-Emitting Layer (LEL)

The light-emitting layer of the invention comprising a phosphorescent light emitting material, a host and an efficiency enhancing material has been described previously.

Fluorescent Light-Emitting Materials and Layers (LEL)

In addition to the phosphorescent materials of this invention, other light emitting materials may be used in the OLED device in the same or separate layers, including fluorescent materials. Although the term "fluorescent" is commonly used to describe any light emitting material, in this case we are referring to a material that emits light from a singlet excited state. Fluorescent materials may be used in the same layer as the phosphorescent material, in adjacent layers, in adjacent pixels, or any combination. Care must be taken not to select materials that will adversely affect the performance of the phosphorescent materials of this invention. One skilled in the art will understand that concentrations and triplet energies of materials in the same layer as the phosphorescent material or in an adjacent layer must be appropriately set so as to prevent unwanted quenching of the phosphorescence.

As more fully described in U.S. Pat. Nos. 4,769,292 and 5,935,721, the light-emitting layer (LEL) of the organic EL element includes a luminescent fluorescent or phosphorescent material where electroluminescence is produced as a result of electron-hole pair recombination. The light-emitting layer can be comprised of a single material, but more commonly consists of a host material doped with a guest emitting material or materials where light emission comes primarily from the guest emitting material(s) and can be of any color. The host materials in the light-emitting layer can be an electron-transporting material, as defined below, a hole-transporting material, as defined above, or another material or combination of materials that support hole-electron recombination. Fluorescent emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small molecule emitting materials can be molecularly dispersed into a polymeric host, or the emitting materials can be added by copolymerizing a minor constituent into a host polymer. Host materials may be mixed together in order to improve film formation, electrical properties, light emission efficiency, operating lifetime, or manufacturability. The host may comprise a material that has good hole-transporting properties and a material that has good electron-transporting properties.

An important relationship for choosing a fluorescent material as a guest emitting material is a comparison of the singlet energies of the host and the fluorescent material. It is highly desirable that the singlet energy of the fluorescent material be lower than that of the host material.

Host and emitting materials known to be of use include, but are not limited to, those disclosed in U.S. Pat. No. 4,768,292, U.S. Pat. No. 5,141,671, U.S. Pat. No. 5,150,006, U.S. Pat. No. 5,151,629, U.S. Pat. No. 5,405,709, U.S. Pat. No. 5,484,922, U.S. Pat. No. 5,593,788, U.S. Pat. No. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives, also known as metal-chelated oxinoid compounds (Formula E), constitute one class of useful host compounds capable of supporting electroluminescence, and are particularly suitable for light emission of wavelengths longer than 500 nm, e.g., green, yellow, orange, and red.

E

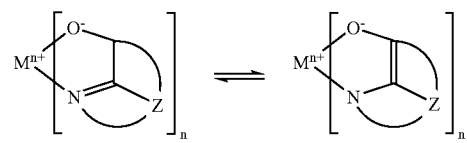

wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; a trivalent metal, such aluminum or gallium, or another metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful metal-chelated oxinoid compounds are the following:

CO-1: Aluminum trisoxine[alias, tris(8-quinolinolato)aluminum(III)]

CO-2: Magnesium bisoxine[alias, bis(8-quinolinolato)magnesium(II)]

CO-3: Bis[benzo{f}-8-quinolinolato]zinc (II)

CO-4: Bis(2-methyl-8-quinolinolato)aluminum(III)-μ-oxo-bis(2-methyl-8-quinolinolato)aluminum(HI)

CO-5: Indium trisoxine [alias, tris(8-quinolinolato)indium]

CO-6: Aluminum tris(5-methyloxine) [alias, tris(5-methyl-8-quinolinolato)aluminum(II)]

CO-7: Lithium oxine[alias, (8-quinolinolato)lithium(I)]

CO-8: Gallium oxine[alias, tris(8-quinolinolato)gallium (III)]

CO-9: Zirconium oxine[alias, tetra(8-quinolinolato)zirconium(IV)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

F

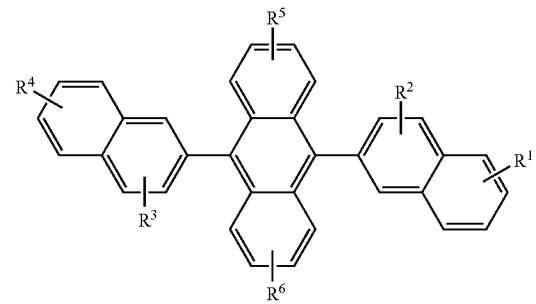

wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl)anthracene and 2-t-butyl-9,10-di-(2-naphthyl)anthracene.

Other anthracene derivatives can be useful as a host in the LEL, including derivatives of 9,10-bis[4-(2,2-diphenylethenyl)phenyl]anthracene.

Benzazole derivatives (Formula G) constitute another class of useful host materials capable of supporting electroluminescence, and are particularly suitable for light emission of wavelengths longer than 400 nm, e.g., blue, green, yellow, orange or red,

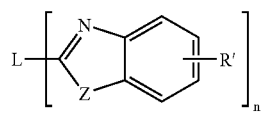

G wherein:
- n is an integer of 3 to 8;
- Z is O, NR or S; and
- R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and
- L is a linkage unit consisting of alkyl, aryl, substituted alkyl, or substituted aryl, which connects the multiple benzazoles together. L may be either conjugated with the multiple benzazoles or not in conjugation with them. An example of a useful benzazole is 2,2',2"-(1,3,5-phenylene)tris[1-phenyl-1H-benzimidazole].

Styrylarylene derivatives as described in U.S. Pat. No. 5,121,029 and JP 08333569 are also useful hosts for blue emission. For example, 9,10-bis[4-(2,2-diphenylethenyl)phenyl]anthracene and 4,4'-bis(2,2-diphenylethenyl)-1,1'-biphenyl (DPVBi) are useful hosts for blue emission.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)amine boron compounds, bis(azinyl)methane compounds, and carbostyryl compounds. Illustrative examples of useful materials include, but are not limited to, the following:

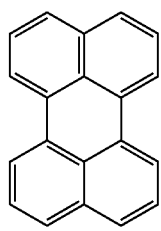

L1

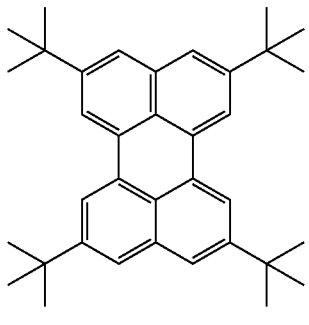

L2

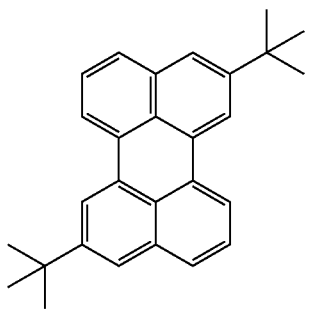

L3

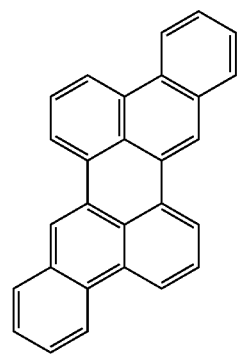

L4

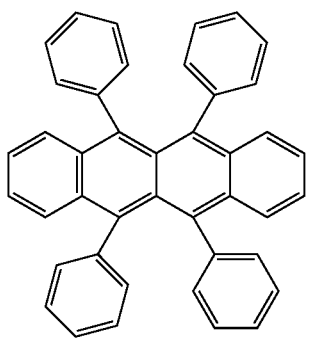

L5

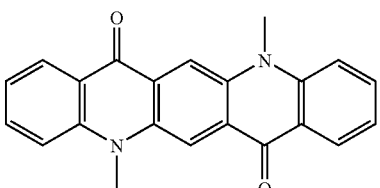

L6

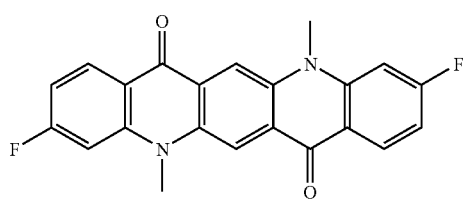

L7

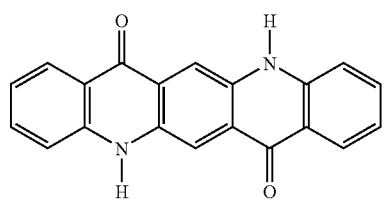

L8

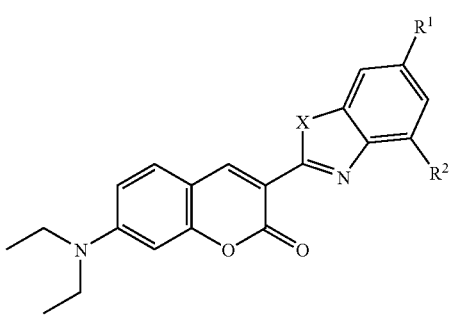

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

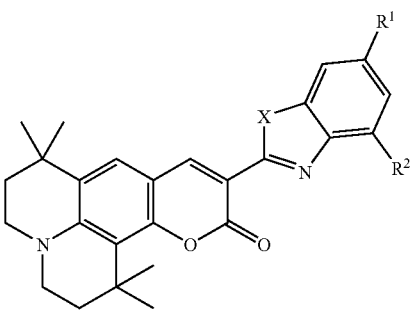

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

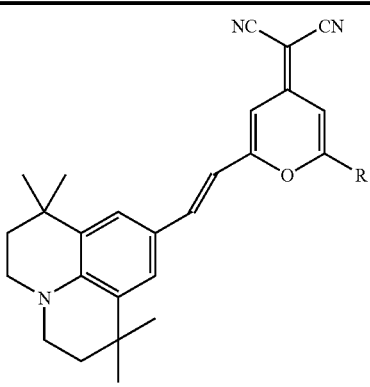

| | R |
|---|---|
| L37 | phenyl |
| L38 | methyl |
| L39 | t-butyl |
| L40 | mesityl |

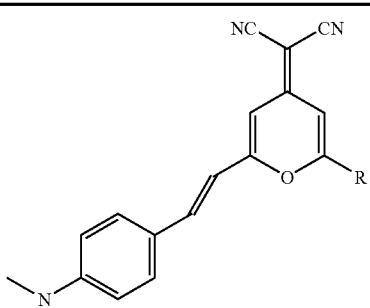

| | R |
|---|---|
| L41 | phenyl |
| L42 | methyl |

-continued
| L43 | t-butyl |
| L44 | mesityl |
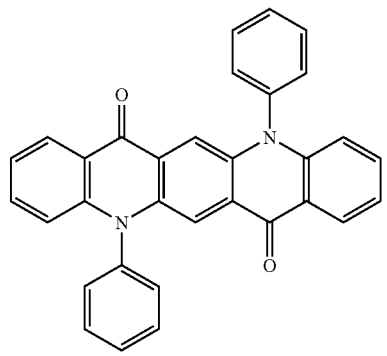
L45
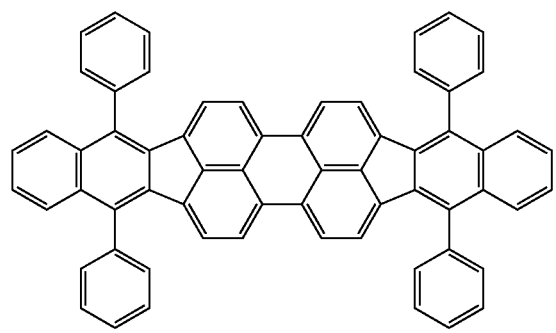
L46
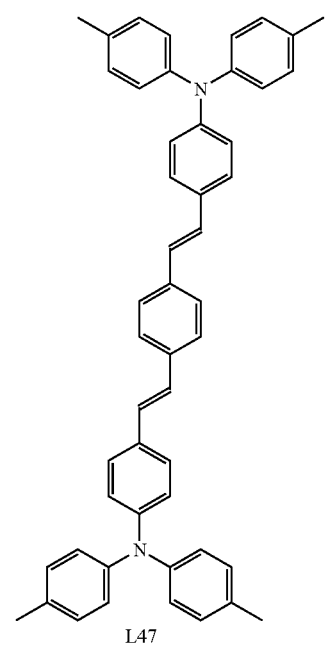
L47
-continued
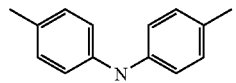
L48
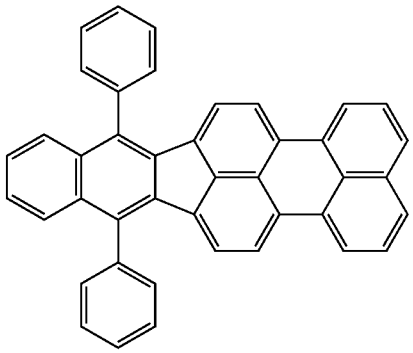
L49
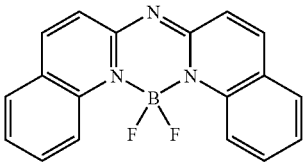
L50
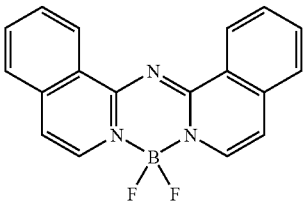
L51

-continued

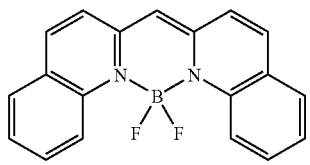

L52

Hole-Blocking Layer (HBL)

In addition to suitable hosts, an OLED device employing a phosphorescent material often requires at least one hole-blocking layer 110 placed between the electron-transporting layer 111 and the light-emitting layer 109 to help confine the excitons or recombination events to the light-emitting layer comprising the host and phosphorescent material. In this case, there should be an energy barrier for hole migration from the host into the hole-blocking layer, while electrons should pass readily from the hole-blocking layer into the light-emitting layer comprising a host and a phosphorescent material. The first requirement entails that the ionization potential of the hole-blocking layer 110 be larger than that of the light-emitting layer 109, preferably by 0.2 eV or more. The second requirement entails that the electron affinity of the hole-blocking layer 110 not greatly exceed that of the light-emitting layer 109, and preferably be either less than that of light-emitting layer or not exceed that of the light-emitting layer by more than about 0.2 eV.

It is further desirable, but not absolutely required, that the triplet energy of the hole-blocking material be greater than that of the phosphorescent material and yet more desirable that the triplet energy of the hole-blocking material be greater than that of the host material. Suitable hole-blocking materials are described in WO 00/70655A2 and WO 01/93642 A1. Two examples of useful hole-blocking materials are bathocuproine (BCP) and bis(2-methyl-8-quinolinolato)(4-phenylphenolato)aluminum(III) (BAlq). Metal complexes other than BAlq are also known to block holes and excitons as described in US 20030068528. In addition, US 20030175553 A1 describes the use of fac-tris(1-phenylpyrazolato-N,$C^{2'}$)iridium(III) (Irppz) for this purpose.

When a hole-blocking layer is used, its thickness can be between 2 and 100 nm and preferably between 5 and 10 nm.

Electron-Transporting Layer (ETL)

Preferred thin film-forming materials for use in constructing the electron-transporting layer 111 of the organic EL devices of this invention are metal-chelated oxinoid compounds, including chelates of oxine itself (also commonly referred to as 8-quinolinol or 8-hydroxyquinoline). Such compounds help to inject and transport electrons, exhibiting high levels of performance, and are readily fabricated in the form of thin films. Exemplary of contemplated oxinoid compounds are those satisfying structural formula (E), previously described.

Other electron-transporting materials suitable for use in the electron-transporting layer 111 include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials.

If both a hole-blocking layer 110 and an electron-transporting layer 111 are used, electrons should pass readily from the electron-transporting layer 111 into the hole-blocking layer 110. Therefore, the electron affinity of the electron-transporting layer 111 should not greatly exceed that of the hole-blocking layer 110. Preferably, the electron affinity of the electron-transporting layer should be less than that of the hole-blocking layer or not exceed it by more than about 0.2 eV.

If an electron-transporting layer is used, its thickness may be between 2 and 100 nm and preferably between 5 and 20 nm.

Other Useful Organic Layers and Device Architecture

An OLED device employing a phosphorescent material can include an exciton-blocking layer, placed adjacent to light-emitting layer 109 on the anode side, to help confine electron-hole recombination events and the resulting excitons to the light-emitting layer 109 comprising the host and phosphorescent material. The exciton-blocking layer may contain a compound having a hole mobility of at least $1 \times 10^{-3}$ $cm^2V^{-1}s^{-1}$ and a triplet energy exceeding that of the light-emitting material of the LEL, as described in the copending application identified in the first paragraph of this application, the contents of which are incorporated herein.

In some instances, layers 109 through 111 can optionally be collapsed into a single layer that serves the function of supporting both light emission and electron transportation. Layers 110 and 111 may also be collapsed into a single layer that functions to block holes or excitons, and supports electron transport. It also known in the art that emitting materials may be included in the hole-transporting layer 107. In that case, the hole-transporting material may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182 and can be equipped with a suitable filter arrangement to produce a color emission.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited by any means suitable for the form of the organic materials. In the case of small molecules, they are conveniently deposited through sublimation or evaporation, but can be deposited by other means such as coating from a solvent together with an optional binder to improve film formation. If the material is a polymer, coating from a solvent is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,688,551, U.S. Pat. No. 5,851,709 and U.S. Pat. No. 6,066,357) or an inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation. Any of these methods of sealing or encapsulation and desiccation can be used with the EL devices constructed according to the present invention.

Optical Optimization

OLED devices of this invention can employ various well-known optical effects in order to enhance their emissive properties if desired. Included are optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the EL device or as part of the EL device.

Embodiments of the invention can provide advantageous features such as higher luminous yield and power efficiency. Embodiments of the organometallic compounds useful in the invention can provide a wide range of hues including those useful in the emission of white light (directly or through filters to provide multicolor displays). Embodiments of the invention can also provide an area lighting device.

The invention and its advantages can be better appreciated by the following examples.

DEVICE EXAMPLE 1

An EL device (Device 1) satisfying the requirements of the invention was constructed in the following manner:

1. A glass substrate coated with an approximately 85 nm layer of indium-tin oxide (ITO) as the anode was sequentially ultrasonicated in a commercial detergent, rinsed in deionized water, degreased in toluene vapor and exposed to an oxygen plasma for about 1 min.
2. Over the ITO was deposited a 1 nm fluorocarbon ($CF_x$) hole-injecting layer (HIL) by plasma-assisted deposition of $CHF_3$.
3. A hole-transporting layer (HTL) of NN'-di-1-naphthyl-N,N'-diphenyl-4,4'-diaminobiphenyl (NPB) having a thickness of 75 nm was then evaporated from a resistance-heated tantalum boat.
4. A 35 nm light-emitting layer (LEL) consisted of mixture of 4,4'-N,N'-dicarbazole-biphenyl (CBP) as a host, fac tris(2-phenylpyridinato)iridium (III) [i.e., $Ir(ppy)_3$] at 6 wt. % as a phosphorescent guest material, and 4,4',4''-tris(N-3-methylphenyl-N-phenyl-amino)triphenylamine (MTDATA) at 1 wt. % as an efficiency-enhancing material was then deposited onto the hole-transporting layer. These materials were evaporated simultaneously from tantalum boats.
5. A hole-blocking layer (HBL) of bis(2-methyl-quinolinolato)(4-phenylphenolato)aluminum(III) (BAlq) having a thickness of 10 nm was then evaporated from another tantalum boat.
6. A 40 nm electron-transporting layer (ETL) of tris(8-quinolinolato) aluminum (III) (Alq) was then deposited onto the light-emitting layer. This material was also evaporated from a tantalum boat.
7. On top of the Alq layer was deposited a 220 nm cathode formed of a 10:1 volume ratio of Mg and Ag.

The above sequence completed the deposition of the EL device. The device, together with a desiccant, was then hermetically packaged in a dry glove box for protection against ambient environment.

DEVICE EXAMPLE 2-5

Devices 2-4 satisfying the requirements of the invention were fabricated in an identical manner to a Device 1 except that the concentration of MTDATA in the LEL, represented as percentage by weight of the light-emitting layer, was as indicated below in Table 1. A comparative Device 5 not satisfying the requirements of the invention was fabricated in an identical manner to Device 1 except that MTDATA was not included in the LEL.

The devices thus formed were tested for efficiency and color at an operating current density of 6 $mA/cm^2$. The results, including 1931 CIE (Commission Internationale de l' Éclairage) coordinates, CIEx and CIEy, are reported in Table 1. The perceived emission color was green.

TABLE 1

Evaluation Results for EL devices.

| Device | MTDATA (wt. %) | Luminous yield (Cd/A) | Power efficiency (lm/W) | CIEx | CIEy | Type |
|---|---|---|---|---|---|---|
| 1 | 1 | 26.5 | 8.1 | 0.315 | 0.624 | Invention |
| 2 | 3 | 26.8 | 7.7 | 0.313 | 0.624 | Invention |
| 3 | 6 | 28.9 | 8.4 | 0.315 | 0.624 | Invention |
| 4 | 10 | 27.8 | 8.6 | 0.310 | 0.626 | Invention |
| 5 | 0 | 18.8 | 6.3 | 0.308 | 0.625 | Comparison |

As discussed above, MTDATA satisfies the criteria for an efficiency-enhancing material to be used with $Ir(ppy)_3$ as the phosphorescent material and CBP as the host material according to the present invention. Thus, Devices 1-4, incorporating MTDATA as an efficiency-enhancing material in the LEL, are constructed according to the present invention. As can be seen from Table 1, they show superior luminous yield and power efficiency relative to Device 5, which lacks the efficiency-enhancing material and, therefore, is not constructed according to the current invention. Moreover, the efficiency was greatest for Device 3, which contained the efficiency-enhancing material within the suitable range of 3-10 by weight.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

| PARTS LIST | |
|---|---|
| 101 | Substrate |
| 103 | Anode |
| 105 | Hole-Injecting layer (HIL) |

-continued

PARTS LIST

| 107 | Hole-Transporting layer (HTL) |
| 109 | Light-Emitting layer (LEL) |
| 110 | Hole-blocking layer (HBL) |
| 111 | Electron-Transporting layer (ETL) |
| 113 | Cathode |

What is claimed is:

1. An electroluminescent device comprising a cathode and an anode and, located therebetween, a light-emitting layer (LEL) and a hole transporting layer between the LEL and the anode, the LEL comprising a phosphorescent guest material, a hole- and electron-transporting host material, and an efficiency-enhancing material, wherein the triplet energy of the phosphorescent guest material is lower than that of the host, wherein the efficiency-enhancing material is present in an amount (1 to 30 wt. % of the LEL) that is sufficient to provide an increase in luminous yield compared to no enhancing material, has an ionization potential lower than that of the host material and, has a triplet energy level that is higher than that of the phosphorescent guest material.

2. The device of claim 1 wherein the efficiency-enhancing material is not emissive.

3. The device of claim 1 wherein the phosphorescent guest material emits green light.

4. The device of claim 1 wherein the phosphorescent guest material emits red light.

5. The device of claim 1 wherein the phosphorescent guest material is an organometallic compound comprising a 5th-row transition metal.

6. The device of claim 1 wherein the metal is iridium or platinum.

7. The device of claim 1 wherein the organometallic compound includes a ligand that can be coordinated to a metal through an $sp^2$ carbon and a heteroatom.

8. The device of claim 7 wherein the ligand is a phenylpyridine group.

9. The device of claim 5 wherein the organometallic compound is chosen from tris(2-phenylpyridinato-N,$C^{2'}$) iridium(III), bis(2-phenylpyridinato-N,$C^{2'}$)iridium(III) (acetylacetonate), bis(2-phenylpyridinato-N,$C^{2'}$)platinum (II), tris(2-phenylquinolinato-N,$C^{2'}$) iridium(III), tris(1-phenylisoquinolinato-N,$C^{2'}$)iridium(III), and tris(3-phenylisoquinolinato-N,$C^{2'}$)iridium(III) groups.

10. The device of claim 1 wherein the efficiency-enhancing material is present at a concentration of 3 to 10% by weight of the light-emitting layer.

11. The device of claim 1 wherein the phosphorescent guest material is present at a concentration of 1 to 20% by weight of the light-emitting layer.

12. The device of claim 1 wherein the phosphorescent guest material is present at a concentration of 3 to 10% by weight of the light-emitting layer.

13. The device of claim 1 wherein the efficiency-enhancing material is a tertiary aromatic amine.

14. The device of claim 13 wherein the efficiency-enhancing material includes two or more triarylamine groups linked together by a linking group.

15. The device of claim 1 wherein the efficiency-enhancing material is a compound represented by Formula (2a),

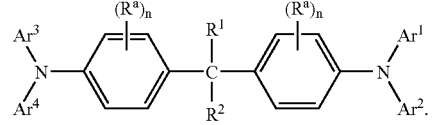

wherein:
$R^1$ and $R^2$ represent hydrogen or substituents, provided $R^1$ and $R^2$ can join to form a ring;
$Ar^1$-$Ar^4$ represent independently selected aromatic groups;
each $R^a$ independently represents hydrogen or an independently selected substituent; and
each n is independently selected as 0-4.

16. The device of claim 1 wherein the efficiency-enhancing material is a compound represented by Formula (2b),

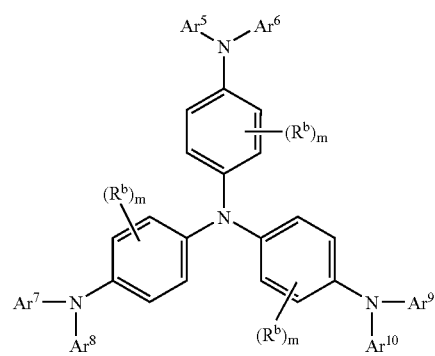

wherein:
$Ar^5$-$Ar^{10}$ independently represent aromatic groups;
each $R^b$ independently represents an independently selected substituent; and
each m is independently selected as 0-4.

17. The device of claim 1 wherein the efficiency-enhancing material is chosen from:
1,1-Bis(4-di-p-tolylaminophenyl)cyclohexane;
1,1-Bis(4-di-p-tolylaminophenyl)-4-phenylcyclohexane;
1,1-Bis(4-di-p-tolylaminophenyl)-4-methylcyclohexane;
1,1-Bis(4-di-p-tolylaminophenyl)-3-phenylpropane;
4,4',4"-Tris(diphenylamino)triphenylamine;
4,4',4"-Tris[(3-methylphenyl)phenylamino]triphenylamine;
Bis[4-(N,N-diethylamino)-2-methylphenyl](4-methylphenyl)methane;
Bis[4-(N,N-diethylamino)-2-methylphenyl](4-methylphenyl)ethane;
4-(4-Diethylaminophenyl)triphenylmethane; and
4,4'-Bis(4-diethylaminophenyl)diphenylmethane.

18. The device of claim 1 wherein the host material comprises a compound selected from arylamine, triazole, indole, and carbazole group containing compounds.

19. The device of claim 1 wherein the host material comprises a carbazole represented by Formula 1:

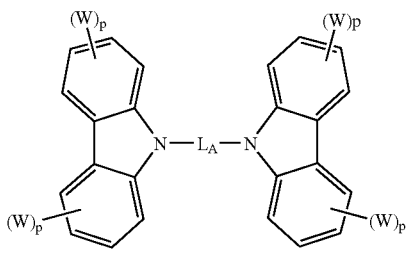

(1)

wherein:
W independently represents hydrogen or an independently selected substituent, p independently is 0-4, and $L_A$ represents a linking group.

20. The device of claim 1 wherein the host material comprises one selected from 4,4'-N,N'-dicarbazole-biphenyl, 4,4'-N,N'-dicarbazole-2,2'-dimethyl-biphenyl, 1,3-bis(N,N'-dicarbazole)benzene, and poly(N-vinylcarbazole) group containing compounds.

21. The device of claim 1 that comprises two or more host materials.

22. The device of claim 1 including a means for emitting white light.

23. The device of claim 22 including two or more compounds capable of emitting complimentary colors.

24. The device of claim 22 including a compound capable of emitting white light.

25. The device of claim 22 including a filtering means.

26. A display comprising the electroluminescent device of claim 1.

27. An area lighting device comprising the electroluminescent device of claim 1.

28. A process for emitting light comprising applying a potential across the device of claim 1.

* * * * *